(12) United States Patent
Koyama et al.

(10) Patent No.: US 7,576,476 B2
(45) Date of Patent: Aug. 18, 2009

(54) PIEZOELECTRIC DEVICE AND METHOD FOR MANUFACTURING THE SAME

(75) Inventors: Yugo Koyama, Ina (JP); Kazuhiko Shimodaira, Minawa-machi (JP)

(73) Assignee: Epson Toyocom Corporation, Tokyo (JP)

( * ) Notice: Subject to any disclaimer, the term of this patent is extended or adjusted under 35 U.S.C. 154(b) by 88 days.

(21) Appl. No.: 11/727,151

(22) Filed: Mar. 23, 2007

(65) Prior Publication Data

US 2007/0228892 A1  Oct. 4, 2007

(30) Foreign Application Priority Data

Mar. 29, 2006  (JP) .............................. 2006-090381

(51) Int. Cl.
  *H01L 41/08* (2006.01)
(52) U.S. Cl. .................................... 310/344
(58) Field of Classification Search .................. 310/344, 310/348
  See application file for complete search history.

(56) References Cited

U.S. PATENT DOCUMENTS

| 6,452,311 B1 * | 9/2002 | Serizawa ..................... 310/363 |
|---|---|---|
| 6,917,142 B2 * | 7/2005 | Koyama et al. ............. 310/344 |
| 7,015,627 B2 * | 3/2006 | Serizawa ..................... 310/340 |
| 7,057,331 B2 * | 6/2006 | Shimodaira et al. ......... 310/344 |
| 2004/0135474 A1 * | 7/2004 | Koyama et al. ............. 310/348 |
| 2004/0245895 A1 * | 12/2004 | Shimodaira et al. ......... 310/348 |
| 2005/0040735 A1 | 2/2005 | Okajima |
| 2005/0093171 A1 | 5/2005 | Sugiura |
| 2005/0184626 A1 * | 8/2005 | Chiba et al. .................. 310/348 |

FOREIGN PATENT DOCUMENTS

| EP | 1 458 086 A1 | 9/2004 |
|---|---|---|
| JP | A 2002-064333 | 2/2002 |

* cited by examiner

*Primary Examiner*—Mark Budd
(74) *Attorney, Agent, or Firm*—Oliff & Berridge, PLC

(57) ABSTRACT

A piezoelectric device includes: a substrate having an electrode terminal portion on an upper surface thereof; an electronic part arranged on an upper side of the substrate; and a piezoelectric resonator arranged on an upper side of the electronic part, wherein a surface of the electronic part opposite to a surface having a pad portion is bonded to a lower surface of the piezoelectric resonator having an external terminal portion and the pad portion of the electronic part and the external terminal portion of the piezoelectric resonator are wire-bonded to each other, and wherein the surface of the electronic part having the pad portion is mounted face down on the upper surface of the substrate.

4 Claims, 9 Drawing Sheets

PIEZOELECTRIC DEVICE AND METHOD FOR MANUFACTURING THE SAME

BACKGROUND OF THE INVENTION

1. Technical Field

The present invention relates to a piezoelectric device including an electronic part and a piezoelectric resonator on a substrate and to a method for manufacturing the piezoelectric device.

2. Related Art

Piezoelectric devices are widely used in hard disk drives (HDDs), mobile computers, or small-size information equipment such as IC cards, mobile phones or car telephones, or mobile communication devices such as a paging system.

FIG. 12 is a partially cutout lateral view showing the internal structure of a conventional piezoelectric device 1. (See JP-A-2002-64333).

The piezoelectric device 1 shown in FIG. 12 has a substrate 2, an electronic part 3 and a piezoelectric resonator 4.

A stud member 7 is installed on the upper surface of the substrate 2. The piezoelectric resonator 4 is mounted on the stud member 7. Space S is formed between the piezoelectric resonator 4 and the substrate 2. The electronic part 3 is arranged in the space S.

The substrate 2 has on its upper surface an electrode terminal portion 6 electrically connected to a mounting terminal 5. The electrode terminal portion 6a and the electronic part 3 are electrically connected to each other.

The electronic part 3 and the piezoelectric resonator 4 are electrically connected to each other by a wiring pattern 8 provided on the stud member 7.

As described above, the entire width of the piezoelectric device 1 is substantially equal to the width of the piezoelectric resonator 4 by arranging the electronic part 3 under the piezoelectric resonator 4, thereby achieving reduction in mounting area.

JP-A-2002-64333 is an example of related art.

Recently, rapid development of thickness reduction is observed in electronic devices such as information devices. Reduction in thickness is also required for piezoelectric devices used in those electronic devices.

On the other hand, it is indeed possible to reduce the mounting area of the piezoelectric device 1 shown in FIG. 12, for example. However, the dimension in the height direction must be large because the substrate 2, the electronic part 3 and the piezoelectric resonator 4 are stacked in the height direction. As a result, it is impossible for the piezoelectric device 1 to fill the requirement of reduction in thickness.

SUMMARY

An advantage of the present invention is to provide a piezoelectric device whose mounting area can be reduced and height can be shortened and to provide a method for manufacturing the piezoelectric device.

A piezoelectric device according to one aspect of the invention includes a substrate having an electrode terminal portion on an upper surface thereof, an electronic part arranged on an upper side of the substrate; and a piezoelectric resonator arranged on an upper side of the electronic part. A surface of the electronic part opposite to a surface having a pad portion is bonded to a lower surface of the piezoelectric resonator having an external terminal portion and the pad portion of the electronic part and the external terminal portion of the piezoelectric resonator are wire-bonded to each other; and wherein the surface of the electronic part having the pad portion is mounted face down on the upper surface of the substrate.

In this case, the piezoelectric device includes the substrate, the electronic part arranged on the upper side of the substrate, and a piezoelectric resonator arranged on the upper side of the electronic part. Therefore, it is possible to reduce the mounting area of the piezoelectric device by stacking the piezoelectric resonator, the electronic part and the substrate in the vertical direction.

Further, the electronic part is bonded to the lower surface of the piezoelectric part having the external terminal portion so that only space formed by adhesive for bonding, for example, is generated between the piezoelectric resonator and the electronic part. Furthermore, the electronic part is mounted face down on the upper surface of the substrate so that only space formed by the bump for face down mounting is generated between the electronic part and the substrate.

Moreover, even if the electronic part is sandwiched between the piezoelectric resonator and the substrate, the pad portion of the electronic part is capable of electrically connecting the piezoelectric resonator and the substrate by utilizing both of the wire bonding and the face down mounting. It should be noted that even if the surface of the electronic part to which wire bonding is performed is mounted face down on the upper surface of the substrate, there arises no fear of short-circuiting provided that no conductive member such as terminal portions is formed in the position corresponding to the position of the substrate at which wire bonding is performed.

Therefore, according to the first aspect of the present invention, it is possible to provide a piezoelectric device whose mounting area can be reduced and the height can be shortened.

It is preferable that the electronic part may be flip-chip connected to the substrate by using a bump and the height of the bump may be greater than such a height that a wire for the wire bonding comes into contact with the substrate.

In this case, the height of the bump may be greater than such a height that a wire for the wire bonding comes into contact with the substrate, so it is possible to reliably prevent the wire from coming into contact with the substrate and being damaged.

It is preferable that a portion defining one of a through hole and a cutout portion may be formed so as to correspond to a position at which wire bonding of the pad portion and the external terminal portion is performed.

In this case, in the substrate, the portion defining one of the through hole and the cutout portion are formed so as to correspond to a position at which wire bonding of the pad portion and the external terminal portion is performed. Therefore, even after the electronic part is mounted face down on and then bonded to the substrate, it is possible to perform wire bonding of the pad portion and the external terminal portion by inserting a capillary or the like into the through hole or the cutout portion. As a result, it is possible to more precisely perform alignment for mounting the electronic part face down on the substrate prior to bonding of the electronic part and the piezoelectric resonator. Further, the wire for wire bonding is prevented from coming into contact with the substrate by inserting the wire for wire bonding into the through hole or the cutout portion even if the dimension in the height direction becomes somewhat large.

It is preferable that at least a space between the lower surface of the piezoelectric resonator and the upper surface of the substrate be molded by using resin so that the upper surface of the piezoelectric resonator may be exposed to the outside.

In this case, at least a space between the lower surface of the piezoelectric resonator and the upper surface of the substrate may be molded by using resin. As a result, it is possible to protect the electronic part and the wire for wire bonding and, at the same time, to enhance the bonding of the piezoelectric resonator and the substrate.

Then, at the time of molding by using resin, since the upper surface of the piezoelectric resonator is exposed to the outside. Therefore, it is possible to prevent the height dimension of the piezoelectric resonator from becoming large due to resin stacked to the upper surface of the piezoelectric resonator.

According to a second aspect of the present invention, a method for manufacturing a piezoelectric device, the piezoelectric device including a substrate having an electrode terminal portion on an upper surface thereof, an electronic part arranged on an upper side of the substrate, and a piezoelectric resonator arranged on an upper side of the electronic part, the method includes: bonding a surface opposite to a surface of the electronic part having a pad portion to a lower surface of the piezoelectric resonator having an external terminal portion; performing wire bonding of the pad portion and the external terminal portion; and mounting the surface of the electronic part having the pad portion face down on the upper surface of the substrate.

In this case, the method for manufacturing the piezoelectric device includes bonding a surface opposite to a surface of the electronic part having a pad portion to a lower surface of the piezoelectric resonator having an external terminal portion and performing wire bonding of the pad portion and the external terminal portion. Therefore, the piezoelectric resonator and the electronic part can be mechanically connected to each other with only space formed by adhesive for bonding, for example, being generated between the piezoelectric resonator and the electronic part. It is also possible to electrically connect the piezoelectric resonator and the electronic part by performing wire bonding.

Further, the method for manufacturing the piezoelectric device includes mounting the surface of the electronic part having the pad portion face down on the upper surface of the substrate. As a result, it is possible to mechanically connect the electronic part and the substrate with only space formed by the bump for face down mounting, for example, being generated between the electronic part and the substrate and, at the same time, to electrically connect the electronic part and the substrate.

Therefore, it is possible to provide the method for manufacturing a piezoelectric device according to which the mounting area of the piezoelectric device can be reduced and the height thereof can be shortened.

According to a third aspect of the present invention, a method for manufacturing a piezoelectric device including a substrate having an electrode terminal portion on an upper surface thereof, an electronic part arranged on an upper side of the substrate, and a piezoelectric resonator arranged on an upper side of the electronic part, the method includes: mounting a surface of the electronic part having the pad portion face down on the upper surface of the substrate; bonding a surface opposite to the surface of the electronic part having the pad portion to a lower surface of the piezoelectric resonator having an external terminal portion; and performing wire bonding of the pad portion and the external terminal portion, wherein a portion defining one of a through hole and a cutout portion is formed in a portion in the substrate at which the wire bonding is performed prior to the wire bonding.

In this case, the method for manufacturing a piezoelectric device includes: mounting a surface of the electronic part having the pad portion face down on the upper surface of the substrate; bonding a surface opposite to the surface of the electronic part having the pad portion to a lower surface of the piezoelectric resonator having an external terminal portion; and performing wire bonding of the pad portion and the external terminal portion. Therefore, as is in the case of the second aspect of the present invention, it is possible to establish electrical and mechanical connection between the piezoelectric resonator and the electronic part and between the electronic part and the substrate while minimizing space respectively therebetween. As a result, it is possible to provide the method for manufacturing a piezoelectric device according to which the mounting area of the piezoelectric area can be reduced and the height thereof can be shortened.

Further, unlike the case of the second aspect of the present invention, the surface of the electronic part having the pad portion is mounted face down on the upper surface of the substrate prior to bonding the electronic part to the lower surface of the piezoelectric resonator. Therefore, it is possible to directly check the outer shape of the electronic part not by way of the piezoelectric resonator, thereby mounting the piezoelectric part face down on the substrate. As a result, it is possible to precisely perform alignment at the time of face down mounting.

The portion defining one of the through hole and the cutout portion is formed in the position of the substrate at which wire bonding is performed. Therefore, it is possible to perform wire bonding by inserting a capillary or the like into the through hole or the cutout portion even if the electronic part is mounted face down on the substrate prior to performing wire bonding.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
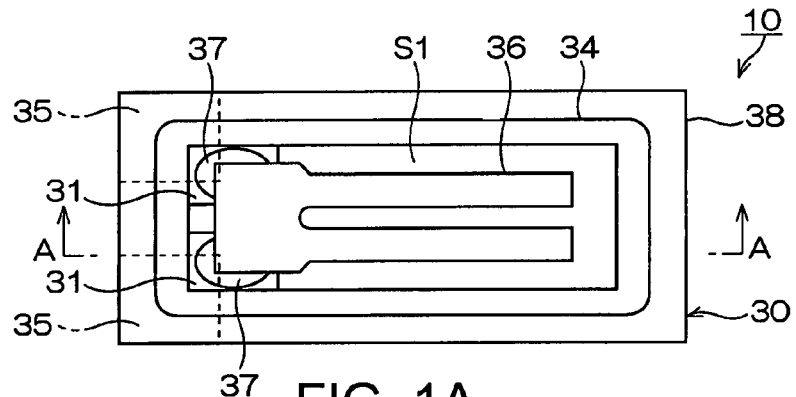
FIG. 1A is a plan view schematically showing the piezoelectric oscillator, which is an example of a piezoelectric device according to a first embodiment of the present invention.
Figure 1B:
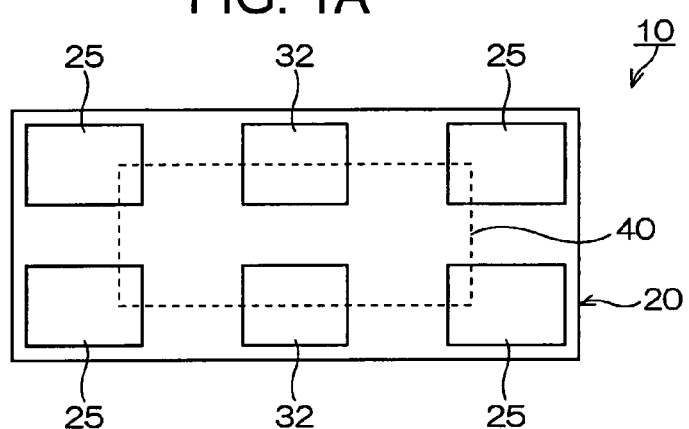
FIG. 1B is a schematic bottom view of the piezoelectric oscillator of FIG. 1B.
Figure 2:
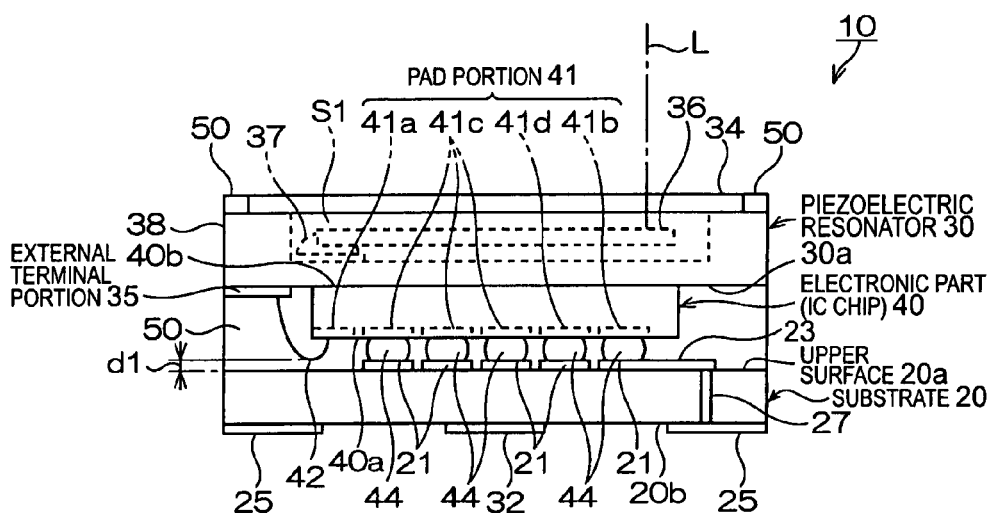
FIG. 2 is a schematic sectional view taken along the line A-A of FIG. 1A.

FIG. 1A, FIG. 1B, and FIG. 2 each show a piezoelectric oscillator 10 as an example of a piezoelectric device according to a first embodiment of the present invention. FIG. 1A is a plan view schematically showing the piezoelectric oscillator 10, FIG. 1B is a bottom view schematically showing the piezoelectric oscillator 10, and FIG. 2 is a sectional view taken along the line A-A of FIG. 1A. It should be noted that in those figures a mould resin (described later) are so shown as to be transparent for convenience of explanation.

As shown in those figures, the piezoelectric oscillator 10 has a substrate 20, an electronic part 40 arranged on an upper surface 20a of the substrate 20, a piezoelectric resonator 30 arranged above the electronic part 40.

The piezoelectric resonator 30 is a resonator for surface mounting including a rectangular package 38 in which an internal space S1 is formed. On an inner bottom surface exposed to the internal space S1 in the package 38, there are provided electrode portions 31, 31 obtained by performing nickel-plating and gold-plating on a tungsten metalized layer. The electrode portions 31, 31 are electrically connected to respective external terminal portions 35, 35 (shown by doted lines in FIG. 1) each provided in the vicinity of a corner of peripheral portion of the lower surface (bottom portion) 30a of the piezoelectric resonator 30. On the upper surface of the electrode portions 31, 31, a piezoelectric resonator element 36 formed from a piezoelectric material such as quartz are fixed by bonding with the aid of conductive adhesive 37, 37, thereby making it possible to electrically connect the external terminal portions 35, 35 and the piezoelectric resonator element 36.

Further, a lid 34 is bonded to an upper end surface of the package 38 which is opened with the aid of a brazing material (not shown), thereby sealing up the internal space S1.

It should be noted that the lid 34 can be made from metal so as to be grounded. It is also possible to make the lid from a material transparent to light such as thin glass, thereby making it possible to perform frequency adjustment using a technique of reducing mass by irradiating a metal-coated part (not shown) of the piezoelectric resonator element 36 with external laser light L even after sealing up the lid, as shown in FIG. 2.

In this embodiment, the electronic part 40 is an oscillator circuit element (hereinafter called as "IC chip") formed of a semiconductor element or the like having at least a circuit that oscillates the piezoelectric resonator 30. Data for temperature compensation according to the characteristics of the piezoelectric resonator 30 is preferably written in the IC chip 40. The IC chip 40 is smaller in outer shape than piezoelectric resonator 30 and the substrate 20 (that is to say, the IC chip 40 is smaller in longitudinal direction than the piezoelectric resonator 30 and the substrate 20), so that the IC chip 40 is disposed so as not to project from between the piezoelectric resonator 30 and the substrate 20.

Further, the IC chip 40 has a plurality of pad portions 41, 41, ... solely on one side 40a of the major surface (the lower surface shown in FIG. 2). It goes without saying that the number or the type of the pad portions 41 of the IC chip 40 is variable depending on the type of the IC chip. According to this embodiment, the pad portions 41 includes a gate/drain (G/D) terminal 41a electrically connected to the piezoelectric resonator 30, an input/output terminal 41b of the oscillator circuit connected to the mounting terminal portion, a control terminal 41c, through which data is written into the oscillator circuit, and a ground terminal 41d.

It should be noted that not all of the pad portions 41 are shown in FIG. 2. For example, there are two gate/drain (G/D) terminals 41a connected to the piezoelectric resonator 30 on the periphery of the IC chip 40. According to this embodiment, two gate/drain terminals 41a are disposed at outer side than the other terminals 41b, 41c and 41d so as to be adjacent to the external terminal portions 35, 35 of the piezoelectric resonator 30.

The substrate 20 is formed by a flat rigid substrate, a flexible substrate or the like. According to this embodiment, the width in the horizontal direction of the substrate 20 is substantially the same as that of the piezoelectric resonator 20. As seen in plan view, the substrate 20 is so positioned as to overlap the piezoelectric resonator 30. As shown in FIG. 1B and FIG. 2, a plurality of mounting terminals 25, 25, 25, 25 and adjustment terminals 32, 32 are provided on the lower surface (bottom surface) 20b of the substrate 20 so that signal or drive voltage is applied from outside to the IC chip 40, the piezoelectric resonator 30 or the like. It should be noted that one of the plurality of mounting terminals 25 is a ground terminal, one a dummy terminal. By providing terminals on the respective four corners, balance can be kept at the time of mounting.

To be more specific, the substrate 20 is formed so thin as to have flexibility and has an insulating film formed from polyimide, glass epoxy or the like in view of heat resistance or the like and a plurality of electrode terminals 21, 21, ... formed on the upper surface of this insulating film.

As materials for those electrode terminals 21, ... conductive materials such as copper foil. The electrode terminals 21, ... are formed on the upper surface 20a of the substrate 20. A part of the electrode terminals 21, ... is electrically connected to the mounting terminals 25, 25, 25, 25 via wiring pattern 23, via hole 27 and the like and serves as terminals for output/input, grounding or the like. Further, other part of the electrode terminals 21, ... is electrically connected to the adjustment terminals 32, 32 and serves as terminals, thorough which data is written into the IC chip 40.

Further, the substrate 20 is so formed as to have an insulating film (not shown) by photolithography technique so that only the plurality of electrode terminals 21 are exposed to the upper side of the substrate 20. As a result, the wiring pattern running between the respective electrode terminals 21, the substrate 20 and the like is covered by the insulating film (not shown), thereby making it possible to effectively prevent short circuiting during wire bonding or flip-chip bonding (described later). Here, as shown in FIG. 2, the piezoelectric resonator 30 and the IC chip 40 of the piezoelectric oscillator 10 are so arranged that the lower surface 30a of the piezoelectric resonator 30 having the external terminal portions 35 is bonded to the surface 40b opposite to the surface 40a of the IC chip 40 having the pad portions 41.

To be more specific, the gate/drain (G/D) terminal 41a, which is one of the pad portions 41 of IC chip 40, is arranged to be adjacent to the external terminal portions 35 of the piezoelectric resonator 30, thereby fixing the IC chip 40 on the lower surface 30a of the piezoelectric resonator 30 by bonding using non-conductive adhesive.

Further, the gate/drain (G/D) terminal 41a, which is one of the pad portions 41 of IC chip 40, is wire-bonded to the external terminal portions 35, thereby connecting the piezoelectric resonator 30 and the IC chip 40.

It should be noted that the gate/drain (G/D) terminal 41a and the external terminal portions 35 are arranged to be adjacent to each other, as described above, so it becomes possible to keep the dimensions of the bonding wire 42 such as length or height (vertical direction of FIG. 2) as small as possible.

Furthermore, the IC chip 40 and the substrate 20 are so arranged that the surface 40a (i.e. the surface to which wire-bonding is performed) of the IC chip 40 having the pad portions 41 is connected to the upper surface 20a of the substrate 20 by face down mounting.

To be more specific, in most cases, bumps (projecting electrodes) 44 are formed on the respective pad portions 41 of the IC chip 40 to be mounted face down on the respective electrode terminal portions 22, thereby electrically connecting, that is to say, flip-chip connecting the bumps 44 and the electrode terminal portions.

The height of those bumps 44 are preferably such that the wire 42 for wire bonding does not contact the substrate 20, so that a gap d1 is made between the top of the wire 42 and the upper surface 20a of the substrate 20 after face down mounting.

Note that in this embodiment as system of flip-chip connection, Au—Au bonding system is employed, according to which both of the bumps 44 and the electrode terminal portions 21 of the substrate 20 are made from gold (Au) and bonded by melting utilizing load and ultrasonic wave. However, it should not be construed restrictively. According to the present invention, it goes without saying that other metal bonding such as Au—Su bonding system or thermo-compression bonding system using solder, anisotropic conductive paste or the like can be used.

Further, in the piezoelectric oscillator 10, at least the lower surface 30a of the piezoelectric resonator 30 and the upper surface 20a of the substrate 20 are molded by resin 50 so that a top portion (lid 34) of the piezoelectric resonator 30 is exposed to the outside. As a result, the IC chip 40, the wire 42 and the like arranged between the piezoelectric resonator 30 and the substrate 20 are protected, and at the same time, the bonding strength of the piezoelectric resonator 30, the IC chip 40, and the substrate 20 is enhanced. It should be noted that thermo-setting liquid resin can be used as the resin 50, for example.

The resin 50 also adheres to the outside of the lid 34 of the piezoelectric resonator 30, thereby making it possible to prevent the lid 34 from becoming chipped or cracking.

As described above, according to this embodiment, wire bonding and flip-chip connection are both performed to the plural of pad portions 41 provided the same surface 40a of the IC chip 40, thereby sandwiching the IC chip 40 between the piezoelectric resonator 30 and the substrate 20 substantially without forming gap and making it possible to establish electrical connection between the piezoelectric resonator 30 and the IC chip 40 and between the substrate 20 and the IC chip 40.

Note that the method for manufacturing the piezoelectric oscillator 10 will be described in detail later but can be summarized as follows: The piezoelectric resonator 30 and the IC chip 40 are bonded by performing wire bonding before being flip-chip connected so that during establishing flip-chip connection the camera does not directly detect the position of the IC chip 40 but detects the position of the piezoelectric resonator 30 while mounting the IC chip 40 face down on the upper surface 20a of the substrate 20. Therefore, it is preferable that the electrode terminal portions 21 of the substrate 20 be made relatively wide in advance in consideration of the dimensional deviation of the bonding position of the piezoelectric resonator 30 and the IC chip 40.

Figure 3:
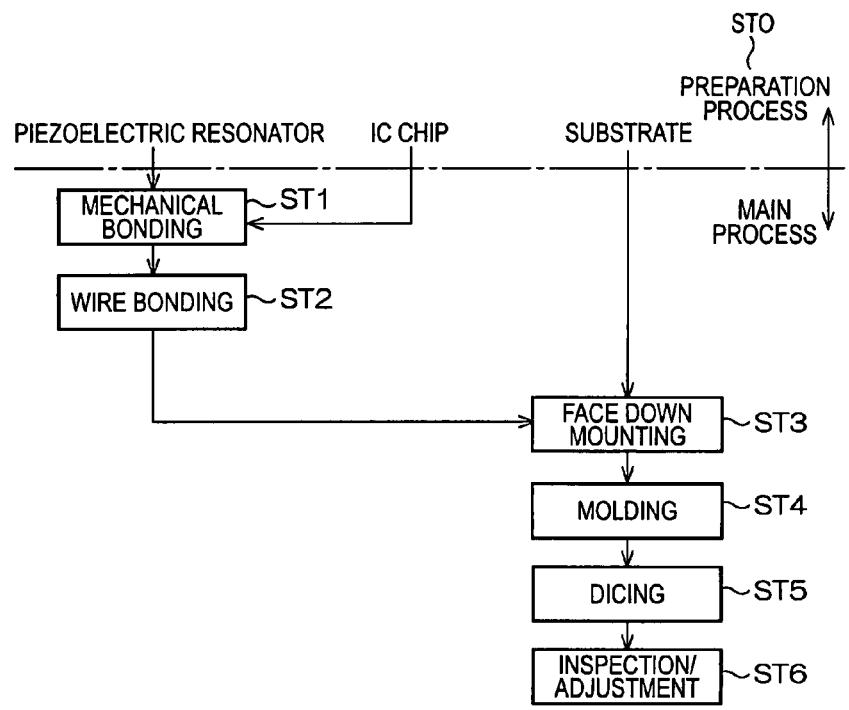
FIG. 3 is a view showing the steps of the method for manufacturing the piezoelectric oscillator according to the first embodiment of the present invention.
Figure 4:
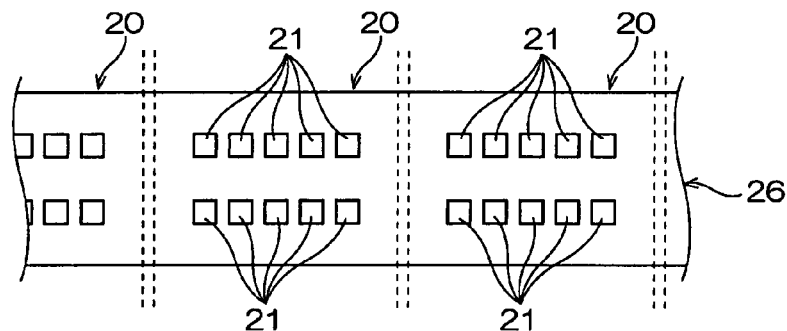
FIG. 4 is a view showing the substrate during the preparation process of FIG. 3.
Figure 5A:
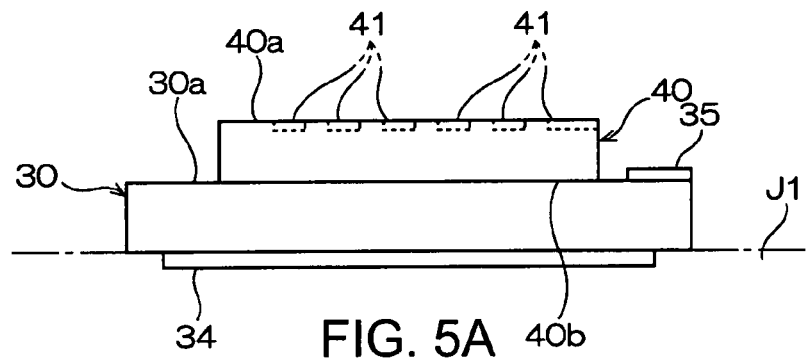
FIG. 5A is a view relating to the step ST1 of FIG. 3.

Next, the method for manufacturing the piezoelectric oscillator 10 with reference to FIG. 3, FIG. 4 and FIG. 5A thorough 5C.

Figure 5B:
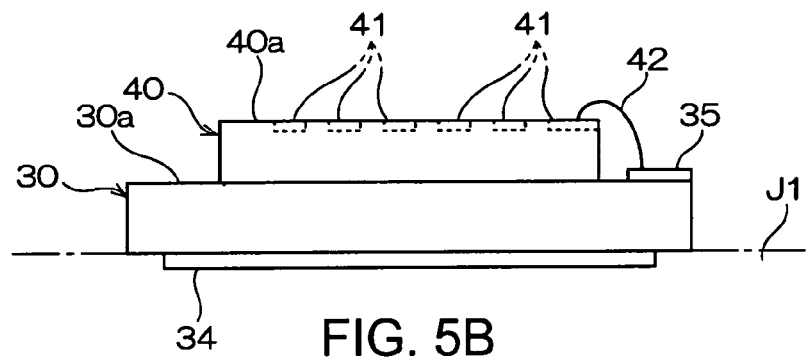
FIG. 5B is a view relating to the step ST2 of FIG. 3.
Figure 5C:
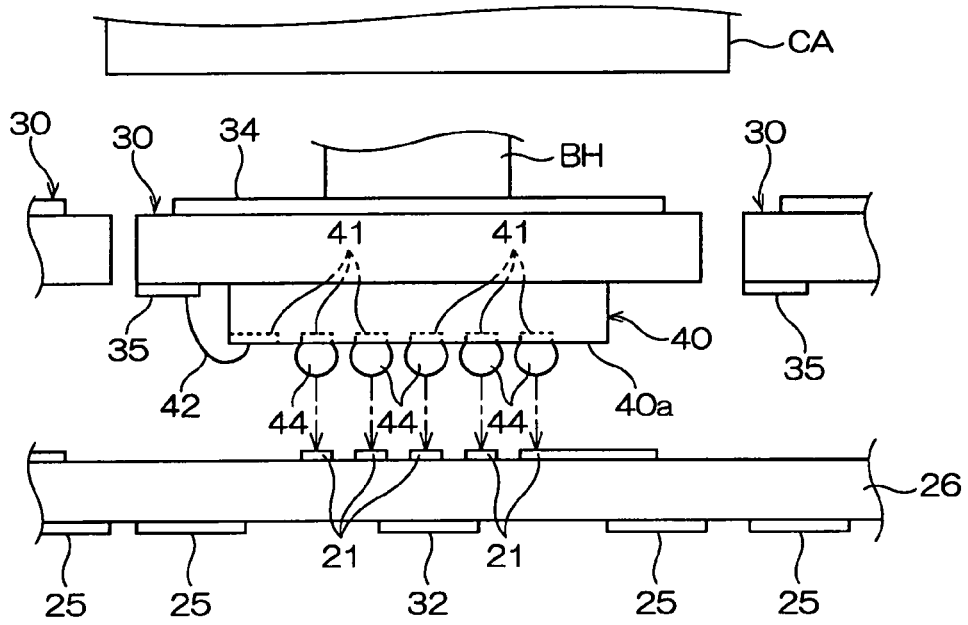
FIG. 5C is a view relating to the step ST3 of FIG. 3.
Figure 6:
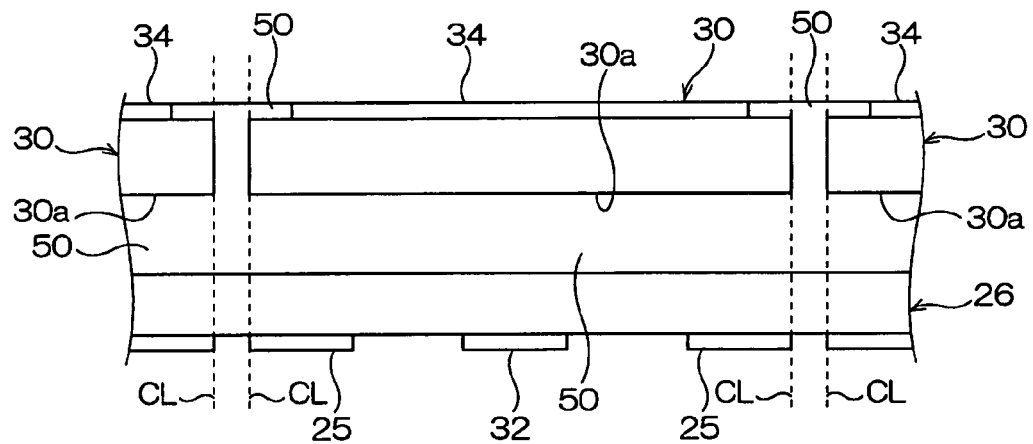
FIG. 6 is a view relating to the steps ST4 and ST5 of FIG. 3.

FIG. 3 is a view showing the steps of the method for manufacturing the piezoelectric oscillator 10, FIG. 4 is a view schematically showing the preparation process (ST0) of FIG. 4, FIG. 5A through 5C are views relating to the steps ST1 thorough ST3 of FIG. 3, respectively, and FIG. 6 is a view relating to the steps ST4 and ST5 of FIG. 3.

To be more specific, as shown in FIG. 3, the piezoelectric oscillator 10 is manufactured as follows: First, the above-mentioned piezoelectric resonator 30, the IC chip 40, and the substrate 20 are separately prepared (see FIG. 1 and FIG. 2) and subjected to pre-processing (see step ST0 of FIG. 3: preparation process) before being subjected to main-processing, that is, before being connected to each other (see steps ST1 thorough ST6 of FIG. 3).

As shown in FIG. 4, during the preparation process, a plurality of substrates 20 different in length corresponding to the different size of a plurality of piezoelectric oscillators form a film-like substrate 26 arranged in-line in order to form piezoelectric oscillators of different size at the same time. To be more specific, a plurality of electrode terminal portions 21, . . . are formed on the upper surface of an insulating film formed of film-like polyimide or the like by performing etching, printing, vapor deposition, plating or the like by using conductive materials such as copper film. Then, resist is applied on the entire upper surface of the film-like substrate 26, thereby performing masking. After that, only the portions of the electrode terminal portions 26 are exposed to light to be exposed to outside, thereby forming an insulating film. Note that the doted line of FIG. 4 shows the cutting line during the step ST5 of dicing of FIG. 3, which will be described later.

Then, as shown in FIG. 5A, during the main process (steps ST1 thorough ST6 of FIG. 3), the piezoelectric resonator 30 is laid on a jig J1 with the lower surface 30a of the piezoelectric resonator 30 having the external terminal portions 35 facing upward. IC chip 40 is then fixed on the lower surface 30a by bonding using adhesive (not shown). At this time, the surface 40b of the IC chip 40 opposite to the surface 40a having the pad portions 41 is bonded to the lower surface 30a (step ST1 of FIG. 3: mechanical bonding). Further, the IC chip 40 is bonded so as not to cover the external terminal portions 35.

Next, as shown in FIG. 5B, the gate/drain terminal 41a, which is one of the pad portions 41 of the IC chip 40, and the external terminal portions 35 of the piezoelectric resonator 30 are wire-bonded to each other by using a tool such as a capillary (not shown) with the piezoelectric resonator 30 being laid on the jig J1 and the surface 40a of the IC chip 40 having the pad portions 41 facing upward (step ST2 of FIG. 3). Note that the wire bonding may be performed in a usual manner by using wire such as gold wire.

Then, the surface 40a of the IC chip 40 having the pad portions 41 is mounted face down on the upper surface of the substrate 20 (step ST3 of FIG. 3). To be more specific, bumps are formed on the pad portions 41 in the state shown in FIG. 5B, that is, in the state in which the surface 40a of the IC chip 40 having the pad portions 41 faces upward. As the bumps, various bumps such as plated bumps or metal bumps may be used. As an example of the bumps, a stud bump is used which is formed as follows: Spark is applied to the tip of wire formed of gold (Au) or the like thereby forming a ball. After that the boll is pressed to the pad portions 41 to be bonded thereto. Then the wire is torn off therefrom, thereby forming the stud bump.

After that, as shown in FIG. 5C, the film-like substrate 26 obtained by arranging the plurality of substrates formed in the preparation process (step ST0 of FIG. 3) is laid on a jig (not shown). Then, the piezoelectric resonator 30, to which the IC chip 40 is bonded, is held on a bonding head BH with the surface 40a of the IC chip 40 having the pad portions 41 facing downward.

Then, while detecting the outer shape or position of the piezoelectric resonator 30 by using an image recognition camera CA arranged above the piezoelectric resonator 30, each of a plurality of pad portions 44, . . . is positioned so as to be opposed to and come into contact with each of a plurality of electrode terminal portions 21, . . . of the film-like substrate 26. Then, each of the plurality of pad portions 44, . . . and each of the plurality of the electrode terminal portions 21, . . . are press-bonded while ultrasound is applied thereto by the bonding head BH.

Next, as shown in FIG. 6, at least the lower surface 30a of the piezoelectric resonator 30 and the upper surface of the film-like substrate 26 are molded by using resin (step ST4 of FIG. 3). According to this embodiment, also the outside of the lid 34 of the piezoelectric resonator 30 is molded by using resin, thereby preventing the lid 34 from becoming chipped or cracking. As for resin molding, it is possible to perform injection molding by using a mold and insulating member such as epoxy resin or applying resin by screen printing or the like. In this case, it is preferable that the resin 50 be filled or applied so that the top portion (that is, the lid) 34 of the piezoelectric resonator 30 is exposed to the outside. When the resin 50 sticks to the top portion 34 of the piezoelectric resonator 30, it is desirable to remove the resin from the top portion 34 by blasting or brushing.

Next, dicing is performed along the cutting lines CL, CL, . . . shown in FIG. 6, thereby forming each of the piezoelectric oscillators (step ST5 of FIG. 3).

Then, electric properties such as oscillation properties or the like of each of the piezoelectric oscillators are inspected. After that, by using the adjustment terminals 32 provided on the bottom surface of the substrate 20, frequency adjustment is performed while data such as data for temperature compensation corresponding to the characteristics of the piezoelectric oscillators is written in the IC chip. When the desired oscillation properties can not be obtained, as shown in FIG. 2, laser light L is guided through the transparent lid to irradiate the metal coated part of the piezoelectric resonator element 36 within the package 38 with this laser light L, thereby performing frequency adjustment using a technique of reducing mass (step ST6 of FIG. 3: Inspection/adjustment). After that, the piezoelectric oscillator is completed.

As described above, the piezoelectric oscillator 10 includes IC chip 40 arranged on the upper surface 20a of the substrate 20 and the piezoelectric resonator 30 arranged on the upper side of the IC chip 40. As a result, the mounting area can be reduced by stacking the piezoelectric resonator 30, the IC chip 40 and the substrate 20 in the vertical direction.

Further, the IC chip 40 is bonded to the lower surface 30a of the piezoelectric resonator 30 having the external terminal portions 35 thereon. As a result, it is sufficient that space for adhesive between the piezoelectric resonator 30 and the IC chip 40 is provided. Furthermore, the IC chip 40 is mounted face down on the upper surface 20a of the substrate 20. As a result, it is sufficient that space, in which the bumps 44 for face down mounting are formed, is provided between the IC chip 40 and the substrate 20.

Even if the piezoelectric resonator 30 and the IC 20 thus sandwiches the IC chip 40 to thereby achieve reduction in thickness, it is possible to electrically connect the pad portions 41 of the IC chip 40 to the piezoelectric resonator 30 and the substrate 20 by utilizing both of the wire bonding and face down mounting.

Figure 7:
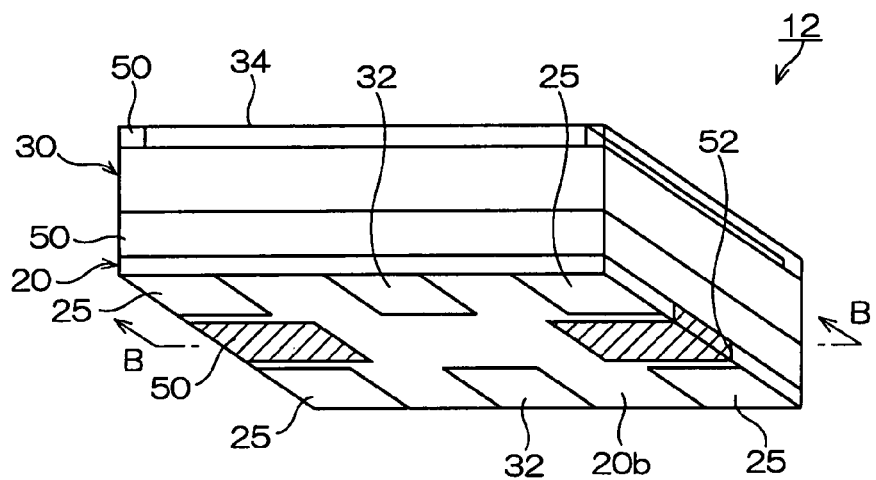
FIG. 7 is a schematic perspective view showing the piezoelectric oscillator as an example of the piezoelectric device according to a second embodiment of the present invention seen from its bottom surface side.
Figure 8:
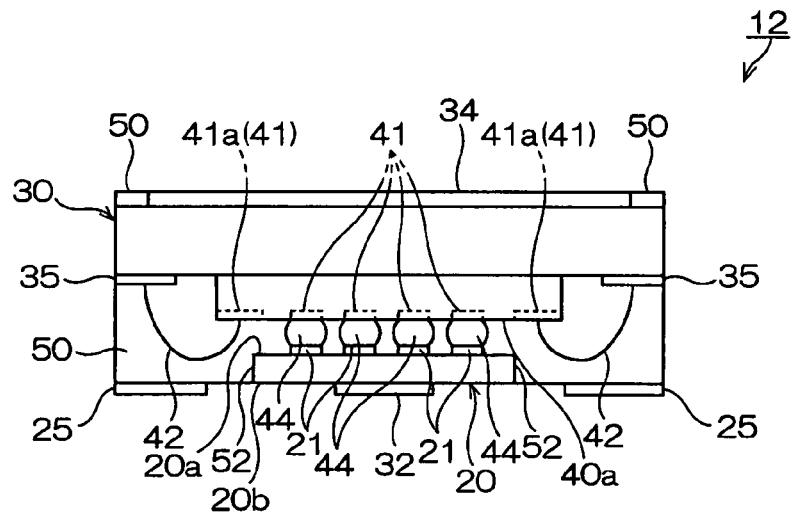
FIG. 8 is a schematic sectional view taken along the line B-B of FIG. 7.

FIG. 7 and FIG. 8 each show a piezoelectric oscillator 12 as an example of the piezoelectric device according to a second embodiment of the present invention. FIG. 7 is a schematic perspective view showing the piezoelectric oscillator 12 seen from its bottom surface side and FIG. 8 is a schematic sectional view taken along the line B-B of FIG. 7.

In those figures, the portions denoted by the same reference symbols used in FIG. 1 thorough FIG. 6 are common to the first and second embodiments, so the explanation thereof will be omitted and the difference between both embodiments will be mainly described hereinafter. The piezoelectric oscillator 12 is principally different from the piezoelectric oscillator 10 shown in FIG. 1 through FIG. 6 in the shape of the substrate 20.

To be more specific, the substrate 20 according to the second embodiment has a through hole or cutout portion 52 formed therein corresponding to the position at which the pad portions 41 and the external terminal portions 35 are wire-bonded to each other.

This through hole or cutout portion 52 is a hole through which a capillary or the like for wire bonding is inserted during manufacture method (described later). The through hole or cutout portion 52 is provided at the position at which the external terminal portions 35 and the gate/drain (G/D) terminal 41a, which is one of the pad portions 41, are exposed to the outside in the state in which the piezoelectric resonator 30, the IC chip 40, and the substrate 20 are stacked in the vertical direction before being molded by using resin.

To be more specific, the through hole or cutout portion 52 is provided in the area at which the mounting terminals 25, 25, 25, 25 in the four corners of the lower surface (bottom surface) 20b of the substrate 20 and the adjustment terminals 32, 32 are not provided and the wire 42, 42 is unlikely to come into contact with the other pad portions 41 or electrode terminal portions 21 at the time of wire bonding. Therefore, according to this embodiment, the through hole or cutout portion 52 is formed on the either end of the substrate 20 in the longitudinal direction by cutting out the center of the substrate 20 in the width direction (marked with parallel-sloped lines in FIG. 7). It should be noted that the through hole or cutout portion 52 is molded by using resin to be sealed up.

The through hole or cutout portion 52 is formed on the either side of the substrate 20 in the longitudinal direction and in the center of the substrate 20 in the width direction. Accordingly, the wire 42, 42 for wire bonding is formed on the either side of the substrate 20 in the longitudinal direction and in the center of the substrate 20 in the width direction. Therefore, the gate/drain (G/D) terminal 41a, which is one of the pad portions 41 of the IC chip 40, and the external terminal portions 35, 35 electrically connected to the piezoelectric resonator element of the piezoelectric resonator 30 are positioned on the either side of the piezoelectric oscillator 12 and in the center of the substrate 20 in the width direction.

Next, the method for manufacturing the piezoelectric oscillator 12 according to the second embodiment will be described with reference to FIG. 9 through FIG. 11C and FIG. 11D.

Figure 9:
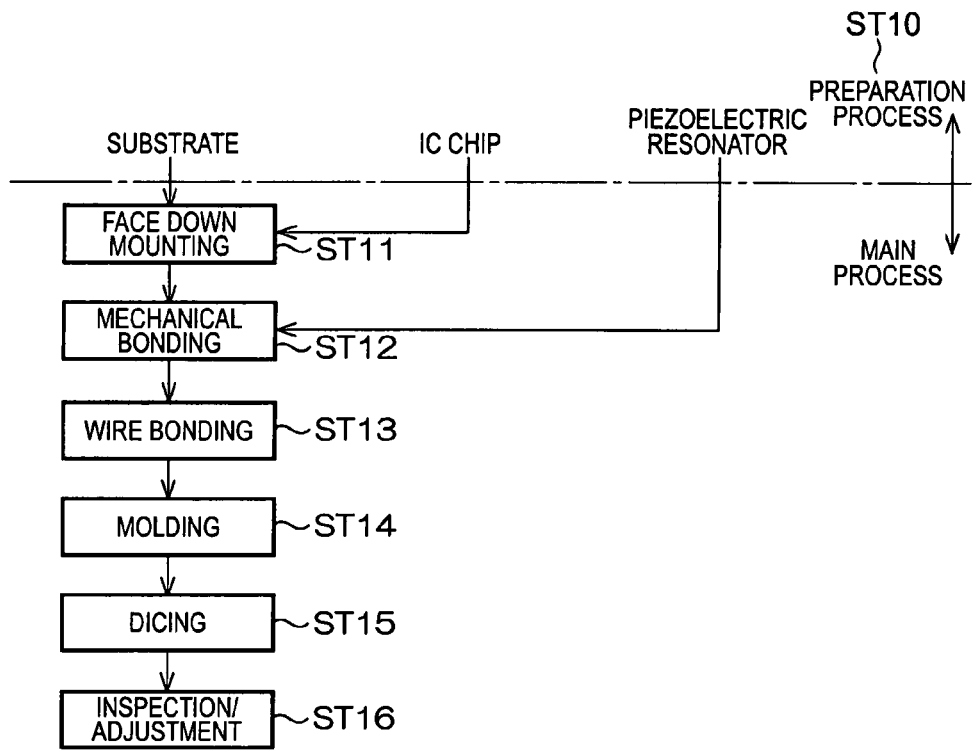
FIG. 9 is a view showing steps of the method for manufacturing the piezoelectric oscillator according to the second embodiment of the present invention.
Figure 10:
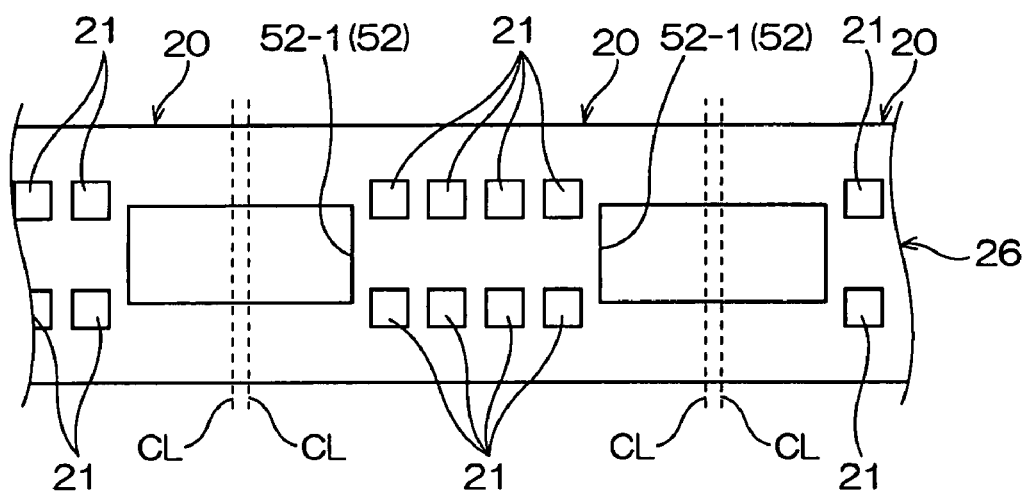
FIG. 10 is a schematic view showing the substrate during the preparation process of FIG. 9.
Figure 11A:
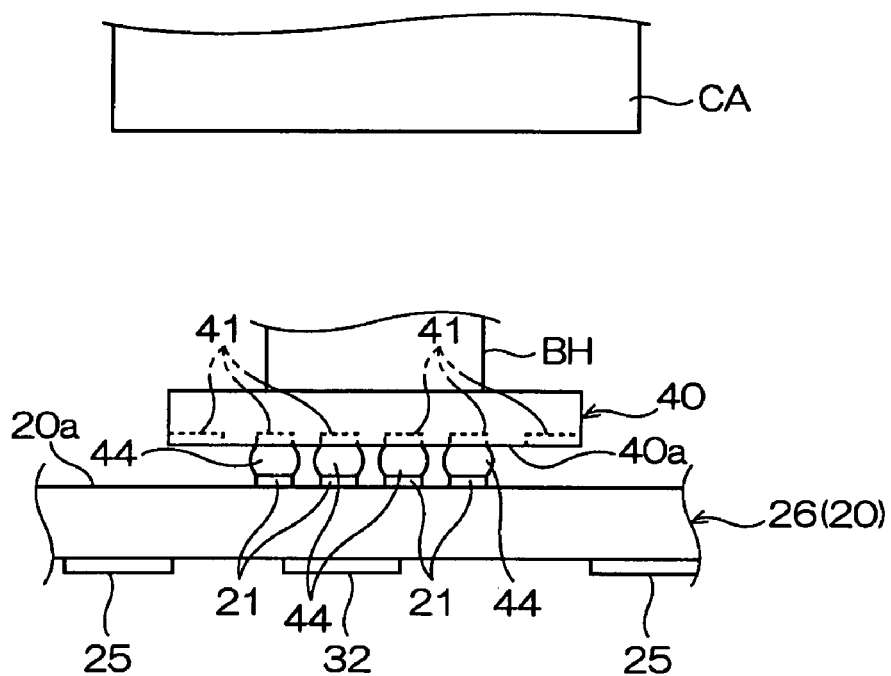
FIG. 11A is a view relating to the step ST11 of FIG. 9.
Figure 11B:
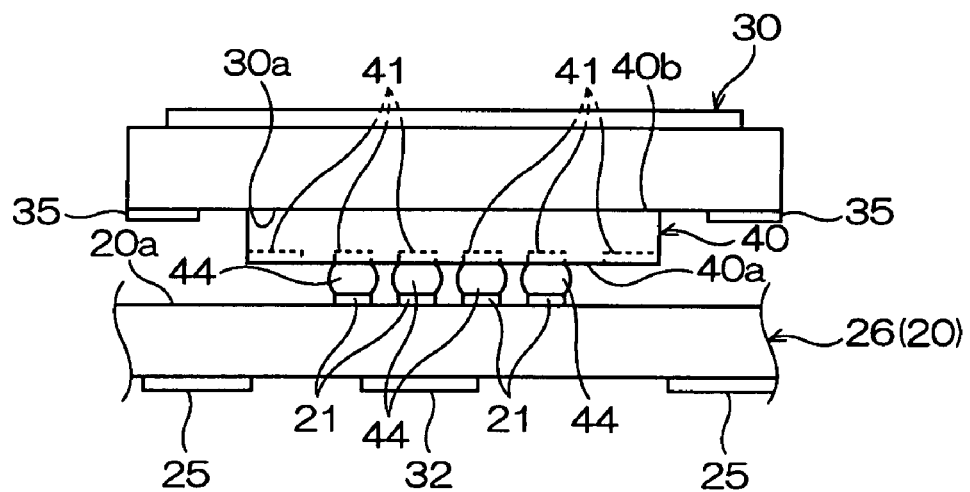
FIG. 11B is a view relating to the step ST12 of FIG. 9.
Figure 11C:
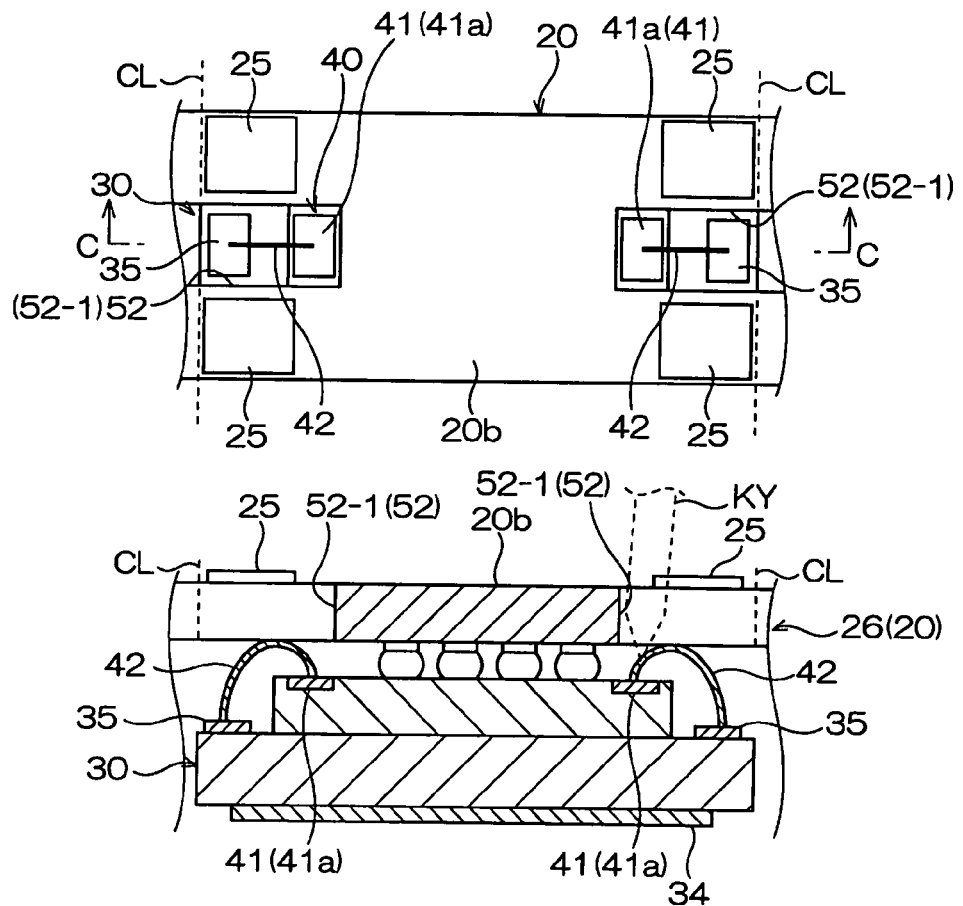
FIG. 11C is a view relating to the step ST13 of FIG. 9.
Figure 11D:
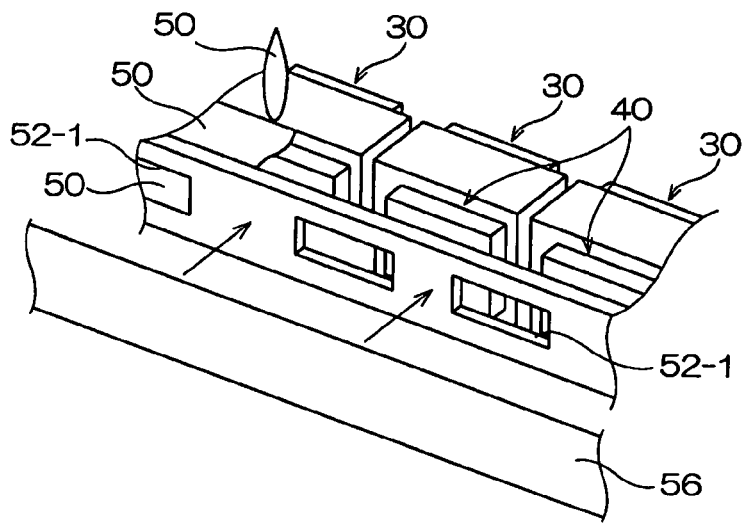
FIG. 11D is a view relating to the step ST14 of FIG. 9.
Figure 12:
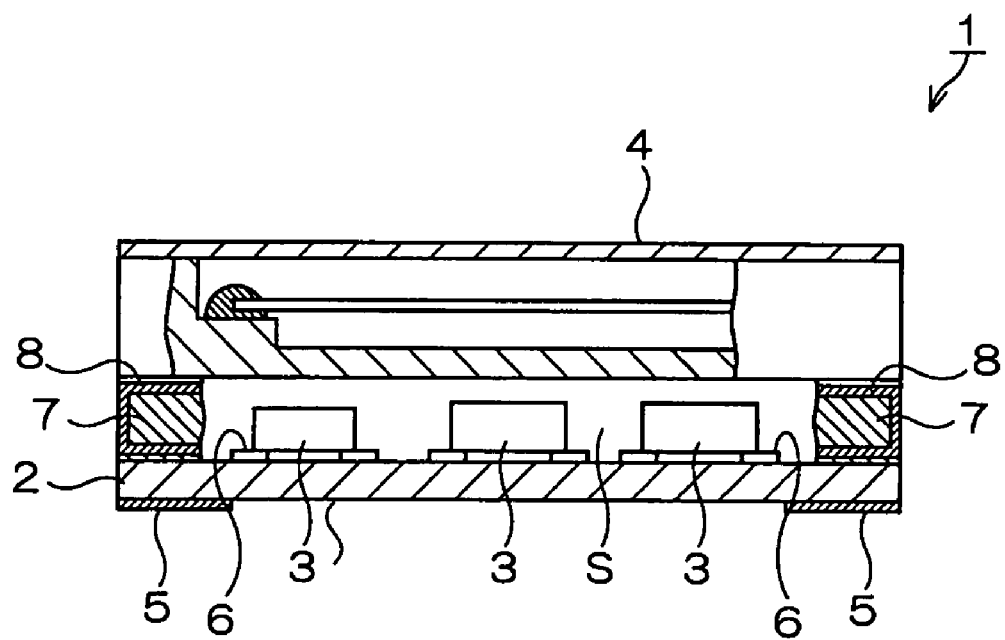
FIG. 12 is a partially cutout view showing the internal structure of a conventional piezoelectric device.

FIG. 9 is a view showing steps of the method for manufacturing the piezoelectric oscillator 12, FIG. 10 is a schematic view showing the substrate during the preparation process (step ST10) of FIG. 9, FIG. 11A and FIG. 11B are views relating to the steps ST11 and ST12 of FIG. 9, respectively, and FIG. 11C and FIG. 11D are views relating to the steps ST13 and ST14 of FIG. 9, respectively. The upper view of FIG. 11C is a schematic plan view in the step ST13 of FIG. 9 and the lower view of FIG. 11C is a schematic sectional view taken along the line C-C of the upper view. Here, for the sake of clarity, the internal construction of the piezoelectric resonator 30 and the IC chip 40 are not shown.

In the steps of the method for manufacturing the piezoelectric oscillator 12 shown in those figures, as is the case of the first embodiment described with reference to FIG. 3 and FIG. 4, the piezoelectric resonator, the IC chip and the substrate are separately prepared and subjected to pre-processing (step ST9 of FIG. 9: preparation process) before being subjected to main-processing, that is, before being connected to each other (see steps ST11 thorough ST16 of FIG. 9).

As shown in FIG. 10, during the preparation process, a plurality of substrates 20 different in length corresponding to the different size of a plurality of piezoelectric oscillators form a film-like substrate 26 arranged in-line. A through hole 52-1 is formed in the center of each of the substrates 26 in the width direction so as to transverse the cutting line CL. The position of the through hole 52-1 corresponds to the position at which wire bonding is performed. When cut along the cutting line CL, the through hole 52-1 becomes the through hole or cutout portions 52.

As shown in FIG. 11A, during the main process of the second embodiment (steps ST11 through ST16 of FIG. 9), the IC chip 40 is held on the bonding head BH and the surface 40a of the IC chip 40 having the pad portions 41 is mounted face down on the upper surface 20a of the substrate 20 (step ST11 of FIG. 9).

As thus described, according to the second embodiment, the IC chip 40 is mounted face down on the piezoelectric resonator 30 and then bonded thereto. As a result, the image recognition camera CA can directly detects the outer shape and position of the IC chip 40 not via the piezoelectric resonator 30. Therefore, it is possible to connect the bumps 44 and the electrode terminal portions 21 of the substrate 20 by aligning the IC chip 40 more precisely.

Next, as shown in FIG. 11B, the lower surface 30a of the piezoelectric resonator 30 having the external terminal portions 35 is bonded to the surface 40b of the IC chip 40 opposite to the surface 40a having the pad portions by using adhesive (not shown) (step ST12 of FIG. 9: mechanical bonding). To be more specific, the IC chip 40 is fixed in the area sandwiched between the external terminal portions 35, 35 provided on the either side of the piezoelectric resonator 30 in the longitudinal direction by bonding.

Next, as shown in FIG. 11C, the substrate 20 is turned upside down so that the lower surface (bottom surface) 20b of the substrate 20 faces upward. Then, the gate/drain (G/D) terminals 41a, 41b, which are a part of the pad portions 41, 41 and the external terminal portions 35, 35 are wire-bonded (step 13 of FIG. 9). In this case, wire bonding is performed by utilizing the through hole 52-1 formed in the substrate 20. That is, the through hole 52-1 is formed in such a position so that it corresponds to the position at which wire bonding is performed. As a result, as shown in the upper view of FIG. 11C, seen from the above, the gate/drain (G/D) terminals 41a, 41a of the IC chip 40, which are a part of the pad portions 41, 41, and the external terminal portions 35, 35 of the piezoelectric resonator 20 are so formed as to be collectively exposed to the outside. Therefore, as shown in the lower view of FIG. 11C, it becomes possible to easily perform wire bonding by inserting a capillary KY through the through hole 52-1.

Then, as shown in FIG. 11D, resin molding is performed (step ST14 of FIG. 9). Note that molding may be injection molding using a mold. According to this embodiment, resin 50 is potted to be applied. To be more specific, space in the height direction between the piezoelectric resonator 30 and the substrate 20 is tilted so as to extend in the horizontal direction and to be laid on a jig (not shown), thereby covering the above-mentioned through hole 52-1, other gaps and the like by using a film-like member 56 and applying resin 50 thereto.

Next, similarly to the first embodiment, dicing is performed along the cutting lines CL, . . . of FIG. 10 so that the piezoelectric oscillators are separate from each other (step ST15 of FIG. 9). After that, inspection and/or adjustment is performed (step ST16 of FIG. 9). Then, the piezoelectric oscillator is completed.

The second embodiment of the present invention is constructed as described above and performs the same effects as the first embodiment.

Moreover, the surface 40a of the IC chip 40 having the pad portions 41 is mounted face down on the upper surface 20a of the substrate 20 before bonding the piezoelectric resonator 30 to the IC chip 40. As a result, the IC chip 40 can be mounted face down on the substrate 20 while detecting the position of the IC chip 40 so that it becomes possible to precisely perform alignment.

Then, the position of the through hole or cutout portion 52 (52-1) corresponds to the position at which wire bonding is performed. Therefore, as described above, even in the case in which face down mounting is performed in advance, the external terminal portions 35 and the pad portions 41 can be wire-bonded by inserting the capillary or the like into the through hole or cutout portion 52 (52-1).

Further, the piezoelectric oscillator 12 can be into contact with the substrate 20 because the wire 42 for wire bonding is inserted into the through hole or cutout portion 52 even when the dimension in the height direction becomes larger.

According to the second embodiment, the step of forming the through hole or cutout portion 52-1 in the substrate 26 (see FIG. 11C and FIG. 11D) so that the position of the through hole or cutout portion corresponds to before performing the step of wire bonding (step ST13 of FIG. 9). To be more specific, after the film-like substrate 26 is formed, there is provided the step for post-processing in which the through hole or cutout portion 52 (see FIG. 11C and FIG. 11D) is formed in the film-like substrate 26. However, the present invention is not limited to this embodiment. It is also possible to omit the step of forming the above-mentioned through hole or cutout portion 52-1 and to form in advance the through hole or cutout portion 52-1 (see FIG. 11C and FIG. 11D) so that the position of the through hole or cutout portion 52-1 corresponds to the position in which wire bonding is performed. That is, it is possible to form the through hole or cutout portion during formation of the substrate 26 (specifically, an insulating film formed of film-like polyimide or the like) without performing post-processing.

The present invention is not limited to the above-described embodiments. The constructions according to the above-described embodiments or the various examples may be combined with each other as appropriate, omitted, or combined with further constructions, which are not shown here.

The entire disclosure of Japanese Patent Application No. 2006-090381, filed Mar. 29, 2006 is expressly incorporated by reference herein.

What is claimed is:

1. A piezoelectric device, comprising:
a substrate having an electrode terminal portion on an upper surface thereof;
an electronic part arranged on an upper side of the substrate; and
a piezoelectric resonator arranged on an upper side of the electronic part,
wherein a surface of the electronic part opposite to a surface having a pad portion is bonded to a lower surface of the piezoelectric resonator having an external terminal portion and the pad portion of the electronic part and the external terminal portion of the piezoelectric resonator are wire-bonded to each other, and
wherein the surface of the electronic part having the pad portion is face-down mounted on the upper surface of the substrate.

2. The piezoelectric device according to claim 1, wherein the electronic part is flip-chip connected to the substrate by using a bump and the height of the bump is greater than such a height that a wire for the wire bonding comes into contact with the substrate.

3. The piezoelectric device according to claim 1, wherein a portion defining one of a through hole and a cutout portion is formed at the substrate so as to correspond to a position at which wire bonding of the pad portion and the external terminal portion is performed.

4. The piezoelectric device according to claim 1, wherein at least a space between the lower surface of the piezoelectric resonator and the upper surface of the substrate is molded by using resin so that the upper surface of the piezoelectric resonator is exposed to the outside.

* * * * *